(12) United States Patent
Van Thourhout et al.

(10) Patent No.: US 9,413,139 B2
(45) Date of Patent: Aug. 9, 2016

(54) HYBRID WAVEGUIDE LASERS AND METHODS FOR FABRICATING HYBRID WAVEGUIDE LASERS

(71) Applicants: IMEC VZW, Leuven (BE); Universiteit Gent, Ghent (BE)

(72) Inventors: Dries Van Thourhout, Ghent (BE); Zhechao Wang, Tournai (BE); Joris Van Campenhout, Brussels (BE); Maria Ioanna Pantouvaki, Leuven (BE)

(73) Assignees: IMEC VZW, Leuven (BE); Universiteit Gent, Ghent (BE)

( * ) Notice: Subject to any disclaimer, the term of this patent is extended or adjusted under 35 U.S.C. 154(b) by 76 days.

(21) Appl. No.: 14/321,711

(22) Filed: Jul. 1, 2014

(65) Prior Publication Data

US 2015/0333481 A1 Nov. 19, 2015

(30) Foreign Application Priority Data

Jul. 1, 2013 (EP) ..................................... 13174582

(51) Int. Cl.
| | | |
|---|---|---|
| H01S 5/20 | (2006.01) | |
| H01S 5/022 | (2006.01) | |
| H01S 5/042 | (2006.01) | |
| H01S 5/30 | (2006.01) | |
| H01S 5/02 | (2006.01) | |
| H01S 5/026 | (2006.01) | |
| H01S 5/22 | (2006.01) | |
| H01S 5/227 | (2006.01) | |

(52) U.S. Cl.
CPC ............... *H01S 5/2077* (2013.01); *H01S 5/021* (2013.01); *H01S 5/0203* (2013.01); *H01S 5/026* (2013.01); *H01S 5/02236* (2013.01); *H01S 5/042* (2013.01); *H01S 5/2214* (2013.01); *H01S 5/2218* (2013.01); *H01S 5/2272* (2013.01); *H01S 5/3013* (2013.01); *H01S 5/2027* (2013.01); *H01S 2301/176* (2013.01)

(58) Field of Classification Search
CPC . H01S 5/2077; H01S 5/0203; H01S 5/02236; H01S 5/042; H01S 5/3013; H01S 5/021; H01S 5/2272; H01S 5/2214; H01S 5/026; H01S 5/2218; H01S 2301/176; H01S 5/2027
See application file for complete search history.

(56) References Cited

U.S. PATENT DOCUMENTS

| | | | | |
|---|---|---|---|---|
| 4,955,031 A * | 9/1990 | Jain | ........................... | H01S 5/32 372/44.01 |
| 5,561,301 A * | 10/1996 | Inoue | ..................... | B82Y 20/00 257/13 |
| 2012/0032234 A1* | 2/2012 | Wang | ................ | H01L 21/02381 257/200 |

OTHER PUBLICATIONS

Paladugu, Mohanchand et al., "Site Selective Integration of III-V Materials on Si for Nanoscale Logic and Photonic Devices", Crystal Growth & Design, 2012, 12 (10), pp. 4696-4702.

*Primary Examiner* — Xinning Nu
(74) *Attorney, Agent, or Firm* — McDonnell Boehnen Hulbert & Berghoff LLP

(57) ABSTRACT

The present disclosure relates to a method for integrating a sub-micron III-V waveguide laser on a semiconductor photonics platform as well as to a corresponding device/system. The method comprises providing on a semiconductor substrate an electrically insulating layer, etching a trench having a width in the range between 50 nm and 800 nm through the electrically insulating layer, thereby locally exposing the silicon substrate, providing a III-V layer stack in the trench by local epitaxial growth to form a channel waveguide, and providing a light confinement element for confining radiation in the local-epitaxial-grown channel waveguide.

20 Claims, 17 Drawing Sheets

HYBRID WAVEGUIDE LASERS AND METHODS FOR FABRICATING HYBRID WAVEGUIDE LASERS

CROSS-REFERENCE TO RELATED APPLICATION

This application claims priority to European Patent Application No. 13174582.0 filed on Jul. 1, 2013, the contents of which are hereby incorporated by reference.

FIELD OF THE DISCLOSURE

The disclosed technology relates to hybrid waveguide lasers, e.g., sub-micron hybrid waveguide lasers, and to methods for integrating such waveguide lasers on a semiconductor platform, such as, for example, a silicon photonics platform.

BACKGROUND OF THE DISCLOSURE

Driven by demands from optical I/O, telecommunications, optical computing, and other applications, extensive research is being carried out in the field of integrating III-V semiconductor devices on silicon. Various options have been suggested for integrating electrically pumped lasers and optical amplifiers on a silicon based photonics platforms.

Individual laser dies may be flip chip mounted to a silicon photonics wafer or may be transferred to a silicon platform using an epitaxial lift-off process. Tight mechanical alignment requirements may make this option less attractive for wavelength division multiplexing (WDM) systems, wherein the number of lasers required per chip has increased over the years.

Alternatively, a bonding approach may be used for achieving hybrid integration of III-V semiconductor lasers on a silicon photonics platform (e.g., SOI based) without the need for stringent alignment in the assembly process. Examples of this approach are molecular direct bonding and adhesive bonding. In the molecular direct bonding approach a strong bond between the different wafers/dies is realized by interfacial bonds. Adhesive bonding technology uses a glue, e.g., a polymer or a metal, to realize wafer bonding. In such bonding approaches the alignment between III-V semiconductor structures and silicon structures may be achieved collectively through lithography. Furthermore, many lasers may be fabricated by bonding a single III-V semiconductor die or III-V semiconductor wafer onto the silicon chip, allowing the fabrication of arrays of multi-wavelength lasers integrated with other silicon photonic components suitable for WDM links. However, using a die bonding or wafer bonding approach is relatively expensive.

Besides bonding based integration methods, epitaxial growth of III-V semiconductor layers on silicon recently regained interest for both material science and optical engineering. Despite the large lattice mismatch between silicon and typical III-V semiconductor materials, considerable improvements in both material quality and device performance were achieved through technologies such as lattice-matched growth, the use of a self-organized dislocation network, lateral epitaxial overgrowth and quantum dot epitaxy. However, this approach results in a relatively high fabrication cost due the rather large consumption of expensive III-V semiconductor materials.

SUMMARY OF THE DISCLOSURE

The present disclosure provides methods for manufacturing hybrid III-V waveguide lasers integrated on a semiconductor photonics platform and lasers thus obtained.

Embodiments of the present disclosure are directed to III-V waveguide lasers, e.g., sub-micron III-V waveguide lasers, integrated on a semiconductor photonics platform, e.g., a silicon photonics platform, as well as methods for integrating such III-V waveguide lasers on a silicon photonics platform.

A sub-micron III-V waveguide laser integrated on a semiconductor photonics platform according to an aspect of the disclosure comprises a local-epitaxy-grown channel waveguide having a width in the range between 50 nm and 800 nm and a height in the range between 500 nm and 1200 nm, a lateral cladding layer adjacent to the lateral sides of the channel waveguide, and a light confinement element for confining light in the local-epitaxy-grown sub-micron channel waveguide. The channel waveguide may for example comprise a III-V layer stack comprising a lower cladding layer, an active region, and an upper cladding layer. Although, the present disclosure is not necessarily limited thereto.

The III-V semiconductor waveguide laser may be integrated on a semiconductor photonics platform, which may be a silicon photonics platform, although embodiments are not limited thereto and also other platforms such as germanium based or silicon-germanium based platforms can be used.

According to embodiments of the present disclosure, sufficiently small waveguide lasers can be made so that epitaxial growth of layers with a sufficient high quality can be obtained while at the same time leakage, which typically is considered a major problem in small waveguide lasers, can be controlled.

It should be noted that within the context of this application the term "light confinement element" may be any type of element or feature that allows improving the confinement of light in the channel waveguide (such as in the active region), e.g., that allows increasing the amount of light kept within the sub-micron channel waveguide, e.g., within the active region of the sub-micron channel waveguide. The light confinement element may be provided adjacent to the channel waveguide.

It also should be noted that within the context of this disclosure the term local-epitaxy-grown refers to materials that are grown by epitaxial deposition, whereby the deposition is substantially limited to the specific area where the layer should be grown, which helps to avoid depositing too much material that should be removed afterwards, as well as to avoid additional patterning of the epitaxial material grown after the deposition.

According to embodiments of the disclosure, the light confinement element may include an overlay that is a layer overlaying the channel waveguide and comprising a high refractive index material. The overlay may contain amorphous silicon, polycrystalline silicon, or silicon nitride, for example. Further, the overlay may have a thickness in the range between 50 nm and 200 nm, for example, although the present disclosure is not necessarily limited thereto. In various embodiments, the width of the channel waveguide is in the range between 50 nm and 300 nm, for example, between 100 nm and 300 nm.

It should be noted that within the context of this disclosure the term "high refractive index material" is a material having a refractive index that is higher than the refractive index of the lateral cladding layer. For example, in the context of this disclosure the high refractive index material may have a refractive index in the range between 2 and 4, or perhaps higher than 3.

The sub-micron III-V waveguide laser may be optically coupled to an output waveguide. According to embodiments of the disclosure, the output waveguide may be a deposited waveguide, e.g., having a core made of the same material as the overlay. According to another embodiment, the output waveguide may be a waveguide made in a Silicon On Insulator (SOI) material system, for example, and the core of the output waveguide may be formed in the silicon device layer of the SOI wafer. Optical coupling between the laser and an output waveguide may be obtained by direct coupling, wherein the active region of the laser is in direct contact with the output waveguide at an end facet of the laser. Alternatively, optical coupling between the laser and an output waveguide may be obtained by evanescent coupling, wherein the overlay together with the channel waveguide may function as a first waveguide, and wherein an output waveguide may be provided substantially parallel to the first waveguide and at a distance smaller than about 500 nm from the first waveguide, such that evanescent coupling may be obtained between the first waveguide and the output waveguide. Optical coupling between the laser and an output waveguide may also be obtained by grating assisted coupling, wherein an output waveguide with a grating is provided sufficiently close to the laser waveguide. The evanescent coupling may be significantly altered by the presence of a grating, which may provide a good control over the coupling efficiency.

According to embodiments of the disclosure, the light confinement element for confining light in the channel waveguide may comprise a plateau being provided in the lateral cladding layer at both lateral sides of the channel waveguide such that the channel waveguide is T-shaped. For example, the channel waveguide may have a first, narrow waveguide portion (e.g., having a width in the range between 50 nm and 200 nm and a height in the range between 400 nm and 600 nm), and a second, wider waveguide portion overlaying the first waveguide portion. In this example, the second waveguide portion may contain the active region and have a width in the range between 400 nm and 800 nm and a height between 250 nm and 600 nm, for example. However, the present disclosure is not limited thereto and other suitable dimensions may be used.

The sub-micron III-V waveguide laser may be optically coupled to an output waveguide, which may be a deposited waveguide made from amorphous silicon, polycrystalline silicon, or silicon nitride, for example. Although, the present disclosure is not limited thereto. Alternatively, the output waveguide may be a waveguide made in a Silicon On Insulator (SOI) material system, and the core of the output waveguide may be formed in the silicon device layer of the SOI wafer. In various examples, optical coupling between the laser and the SOI waveguide may be obtained by direct coupling, by evanescent coupling, or by grating assisted coupling as described above.

A waveguide laser according to embodiments of the present disclosure may be small (sub-micron scale) and may have a low threshold and low power consumption.

Further, a laser according to embodiments of the disclosure may be pumped electrically. To enable electrical injection of charge carriers, a first metal comprising contact and a second metal comprising contact may be provided. The first metal comprising contact is in electrical contact with the lower cladding layer of the III-V waveguide layer stack, and the second metal comprising contact is in electrical contact with the upper cladding layer of the III-V waveguide layer stack. The first metal comprising contact may be in indirect electrical contact with the lower cladding layer, for example, through a doped silicon substrate on which the III-V layer stack is provided. The second metal comprising contact may be in indirect contact with the upper cladding layer, for example, through the overlay in embodiments of the disclosure. Alternatively, the second metal comprising contact may be in direct contact with the upper cladding layer, such as in embodiments with a T-shaped channel waveguide according to the disclosure.

A second aspect of the disclosure provides a method for integrating a sub-micron III-V waveguide laser on a semiconductor photonics platform, for instance a silicon photonics platform. The method includes providing on a silicon substrate an electrically insulating layer, etching a trench having a width in the range between about 50 nm and about 800 nm through the electrically insulating layer (thereby locally exposing the silicon substrate), providing a III-V layer stack in the trench by local epitaxial growth to form a channel waveguide, and providing a light confinement element.

According to embodiments of the method of the disclosure, providing a light confinement element may comprise providing an overlay that is a layer overlaying the channel waveguide and containing a high refractive index material. For example, in the context of this application, the high refractive index material may have a refractive index in the range between 2 and 4, and/or perhaps higher than 3. The overlay may for example comprise amorphous silicon, polycrystalline silicon or silicon nitride. The overlay may for example have a thickness in the range between 50 nm and 200 nm. Although, the present disclosure is not limited thereto.

According to embodiments of the method of the disclosure, providing a light confinement element may comprise etching a trench in the electrically insulating layer with a plateau at both lateral sides of the trench such that, after providing the III-V layer stack in the trench, a T-shaped channel waveguide is obtained. The waveguide may have a first, narrow waveguide portion having a width in the range between 50 nm and 200 nm and a height in the range between 400 nm and 600 nm, and a second, wider waveguide portion overlaying the first waveguide portion and containing the active region. The second waveguide portion may have a width in the range between 400 nm and 800 nm and having a height between 250 nm and 600 nm.

In methods of the present disclosure, well-developed semiconductor manufacturing infrastructure may be used for fabricating the sub-micron III-V waveguide lasers and for integrating the sub-micron III-V waveguide lasers on a semiconductor photonics platform. Due to the small device dimensions the consumption of expensive III-V materials may be limited and the fabrication cost may be reduced. Further, as compared to hybrid lasers fabricated by means of a bonding technology, thermal dissipation may be improved.

Certain objects and advantages of various aspects have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein. Further, it is understood that this summary merely provides examples and is not intended to limit the scope of the disclosure. The disclosure, both as to organization and method of operation, together with features and advantages thereof, may best be understood by reference to the following detailed description when read in conjunction with the accompanying drawings.

BRIEF DESCRIPTION OF THE FIGURES

FIG. 4 illustrates a scheme that may be used for direct waveguide coupling of a laser according to an embodiment of the present disclosure, and a scheme for electrical injection.

FIG. 5 illustrates a scheme that may be used for side coupling between a waveguide and a laser according to an embodiment of the present disclosure, and a scheme for electrical injection.

FIG. 6 illustrates a scheme that may be used for direct waveguide coupling of a laser according to an embodiment of the present disclosure, and a scheme for electrical injection.

FIG. 10 illustrates a scheme that may be used for waveguide coupling of a T-shaped laser according to an embodiment of the present disclosure, and a scheme for electrical injection.

Figure 1:
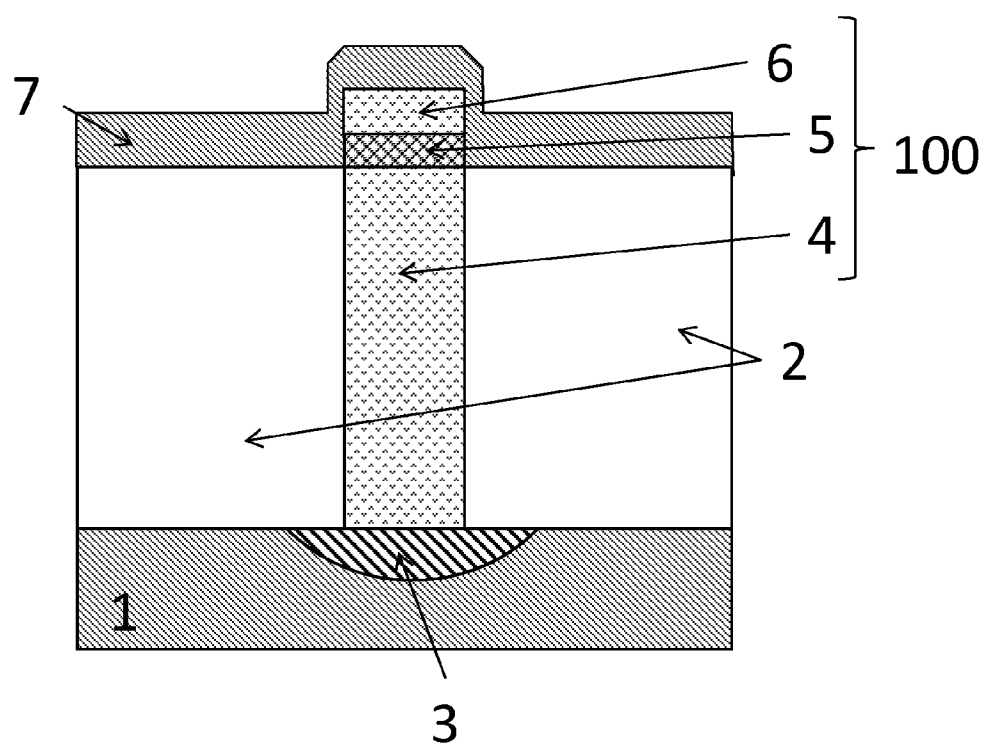
FIG. 1 shows a cross section of a sub-micron hybrid waveguide laser with an overlay according to an embodiment of the present disclosure.

Any reference signs in the claims shall not be construed as limiting the scope of the present disclosure.

In the different drawings, the same reference signs refer to the same or analogous elements.

DETAILED DESCRIPTION OF ILLUSTRATIVE EMBODIMENTS

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

In an inventive aspect, the present disclosure relates to methods for integrating sub-micron III-V waveguide lasers on a photonics platform such as a silicon photonics platform.

In a fabrication method according to an inventive aspect, integrating a sub-micron III-V waveguide laser on a semiconductor photonics platform, e.g., silicon photonics platform, comprises forming a III-V layer stack on a silicon substrate, for example, by local epitaxial growth. Local epitaxial growth may for example be obtained by first providing a masking layer, such as a silicon oxide layer, on the silicon substrate, etching an opening or trench through the masking layer such that the underlying silicon substrate is exposed at the location where a III-V layer stack needs to be provided, and epitaxially growing the layer stack in the opening, using the exposed region as a seed for epitaxial growth.

In the context of the present disclosure, the III-V layer stack may comprise any suitable layer stack for realizing a laser structure, such as for example a III-V heterostructure, or a quantum well embedded between cladding layers, or quantum dots embedded in cladding layers.

It may be an advantage of forming the III-V layer stack directly on the silicon substrate by epitaxial growth that well-developed semiconductor fabrication infrastructure, e.g., CMOS infrastructure, may be used for fabricating the lasers.

It may be an advantage of local epitaxial growth that the consumption of III-V material and therefore also the cost may be reduced, as compared to fabrication processes wherein layers of III-V material are grown non-locally.

In embodiments of the present disclosure, the masking layer is preferably made of a material with a low refractive index, e.g., a material having a refractive index in the range between 1.4 and 1.7, such as a refractive index in the order of about 1.5. This has as a potential advantage that it may have the function of a cladding layer, e.g., it may improve confinement of the optical mode in the waveguide laser, and that it may lead to reduced substrate leakage. In one example, the masking layer is made of an electrically insulating material.

An approach that may be used to reduce the number of defects in thin hetero-epitaxial layers grown on a substrate with high lattice mismatch includes using geometrical defect confinement by selective area epitaxy or Selective Epitaxial Growth (SEG). For example, in US 2012/0032234, a method is described that allows avoiding or substantially reducing the formation of anti-phase domain boundaries in III-V epitaxial layers grown on silicon substrates. A method is described for epitaxially growing a III-V compound semiconductor material on a substrate, the substrate comprising a {100} oriented semiconductor material such as silicon and an insulating layer on the semiconductor material, wherein the insulating layer has recessed regions (trenches) locally exposing the semiconductor material. The method comprises: forming a buffer layer comprising a group IV semiconductor material (such as Ge) in the exposed regions by means of a selective epitaxial growth process; thermally annealing the substrate and the buffer layer, thereby roughening the buffer layer to create a rounded, double-stepped surface of the buffer layer; and at least partially filling the recessed region with a III-V compound semiconductor material by selective epitaxial growth, using the buffer layer as a seeding layer. It was shown that for trenches with an aspect ratio of more than two, almost defect-free layers may be obtained. To avoid the formation of defects the width of the recessed region is smaller or equal than 500 nm, preferably smaller than 200 nm.

Considering the high material quality obtained, this method could be considered as being useful for the realization of active photonic devices, such as lasers, together with silicon photonic circuits. However, because of the lattice mismatch between the III-V materials and the silicon, only small areas of good quality III-V material may be grown on silicon. With the method described in US 2012/0032234 only small sized areas of III-V material layers of good quality may be grown: the recessed regions or openings in the insulating layer need to be sufficiently narrow (e.g., narrower than 500 nm, preferably narrower than 200 nm) to allow blocking of dislocations. Tight light confinement in such narrow III-V strips with acceptable substrate leakage is almost impossible. Therefore, it is a challenge to use this method for photonic applications.

Another approach that may be used to reduce the number of defects (such as e.g. anti-phase boundaries) in hetero-epitaxial layers grown on a substrate with high lattice mismatch comprises the deposition of epitaxial layers in a trench having at its bottom a "V-groove" in the substrate, e.g. silicon substrate, the V-groove having {111} facets. The V-groove may for example be formed by anisotropic wet etching, e.g. using an alkaline solution such as for example a KOH solution (e.g. a 50% KOH solution at 70° C.) or a TMAH solution (e.g. a 5% TMAH solution at 80° C.). When using this approach, preferably an {100} oriented silicon substrate is used, with an insulating layer having recessed regions or trenches on the substrate, such that the silicon substrate is locally exposed. Preferably the recessed regions have a longitudinal axis oriented along a <110> direction. This approach is for example described by M. Paladugu et al in "Site Selective Integration of III-V Materials on Si for Nanoscale Logic and Photonic Devices", Cryst. Growth Des., 2012, 12 (10), pp 4696-4702, for 80 nm and 40 nm wide trenches. Tight light confinement in such narrow III-V strips with acceptable substrate leakage is almost impossible. Therefore, it is a challenge to use this method for photonic applications.

In another inventive aspect the present disclosure relates to hybrid sub-micron III-V waveguide lasers, wherein the waveguides are formed by local or selective epitaxial growth of III-V layers on top of silicon.

Known laser configurations, such as FP (Fabry Perot), DFB (Distributed Feed-Back) and DBR (Distributed Bragg Reflector) lasers, could in principle be realized by selectively growing III-V waveguides on top of silicon. However, the very compact dimensions required for realizing III-V structures with low defect density by local epitaxial growth (such as e.g. in accordance with US 2012/0032234 or by using the "V-groove" approach described above) limit the potential for photonics applications, mainly due to the problem of confining light without substantial leakage loss in such small devices.

In an embodiment of the present disclosure the light confinement is improved by using an overlay, such as for example an amorphous silicon overlay, the present disclosure not being limited thereto, on top of the III-V laser structure. An example of a possible configuration is illustrated in FIG. 1, showing a cross section of a sub-micron hybrid laser formed on a silicon substrate 1. The waveguide laser structure contains a lower cladding layer 4 made of a first III-V material such as for example InP, an active layer 5 made of a second III-V material such as for example InGaAs and an upper cladding layer 6 made of a third III-V material such as for example InP. The lower cladding layer 4, active layer 5 and upper cladding layer 6 are confined in a recessed region or trench formed in an insulating layer 2, such as for example a silicon oxide layer, and form a channel waveguide 100. This insulating layer 2 also functions as a lateral cladding layer at both lateral sides of the waveguide laser structure. The width of the III-V layer stack 100 (corresponding to the width of the recessed region in the insulating layer 2) may for example be in the range between 50 nm and 300 nm, preferably between 100 nm and 300 nm. The lower cladding layer 4 may for example have a thickness in the range between 400 nm and 600 nm. The thickness of the active layer 5 may for example be in the range between 50 nm and 200 nm. The upper cladding layer 6 may for example be 50 nm to 300 nm thick. However, the present disclosure is not limited thereto, and other layer thicknesses and widths may be used.

A III-V waveguide that is extremely narrow, as in embodiments of the present disclosure, would lead to high leakage losses for the optical mode, mainly high leakage losses to the substrate. One possible solution to obtain a low loss waveguide is increasing the trench depth, but this complicates the fabrication process.

In an embodiment of the present disclosure, in order to achieve good optical confinement in the active layer 5 of the III-V waveguide 100, and to reduce leakage losses, an overlay 7 (light confinement element) having a high refractive index as compared to the refractive index of the lateral cladding layer 2, e.g. a refractive index in the range between 2 and 4, preferably higher than 3, is provided on top of the insulating layer 2 and the upper cladding layer 6. In the example shown in FIG. 1, the overlay 7 also covers sidewalls of the active layer 5 and the upper cladding layer 6. However, the present disclosure is not limited thereto and other configurations are possible depending on the specific design of the waveguide laser. The overlay 7 may for example contain amorphous silicon, polycrystalline silicon, silicon nitride or any other suitable high refractive index material known to a person skilled in the art. The thickness of the overlay 7 depends on the material's refractive index and on the width of the III-V layer stack. An amorphous silicon overlay may for example have a thickness in the range between 50 nm and 200 nm, the present disclosure not being limited thereto.

Figure 2:
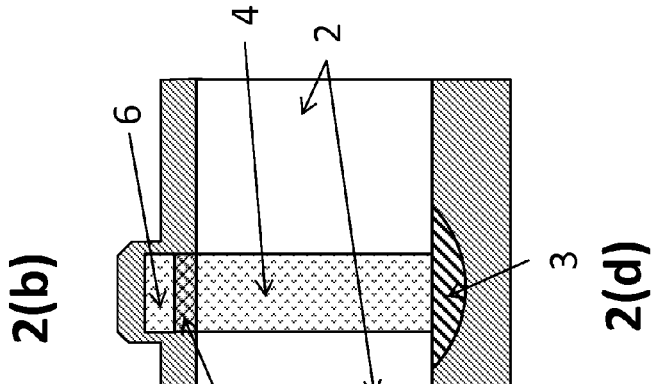
FIG. 2 schematically illustrates a fabrication method for a sub-micron hybrid waveguide laser according to an embodiment of the present disclosure.
Figure 2:
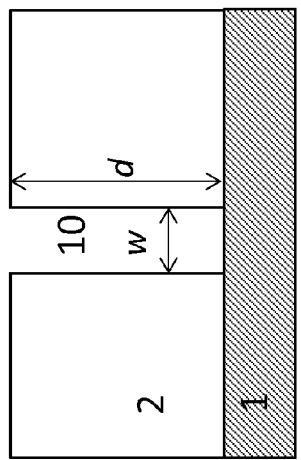
Figure 2:
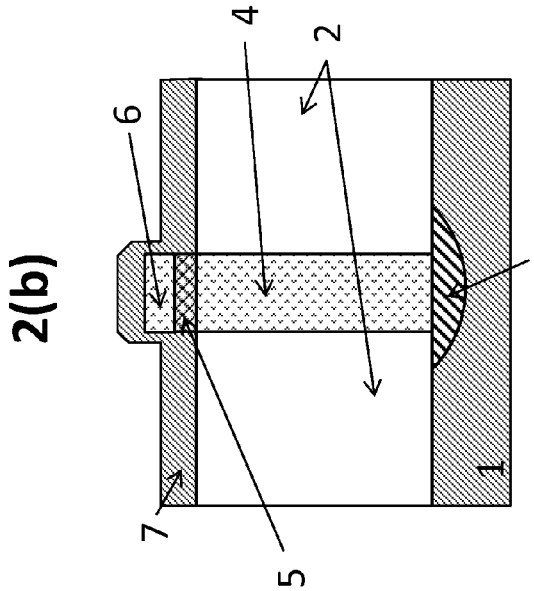
Figure 2:
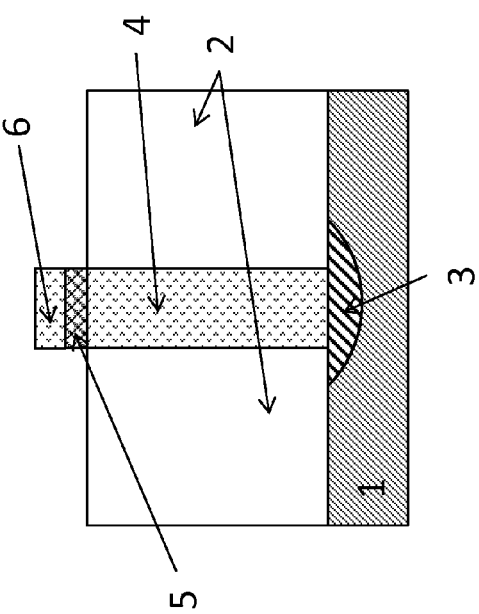

A method that may be used for fabricating the laser structure of FIG. 1 is schematically illustrated in FIG. 2. In a first step (FIG. 2(a)) an electrically insulating layer, e.g. a silicon dioxide layer 2, is provided on a silicon substrate 1. A narrow trench 10 is then etched through the electrically insulating layer 2, thereby locally exposing the underlying silicon substrate 1 (FIG. 2(*b*)). The ratio between the trench depth d and the trench width w is preferably larger than two. For example, the trench depth may be in the range between 400 nm 600 nm; the trench width may for example be in the range between 50 nm and 300 nm, preferably between 100 nm and 300 nm. However, the present disclosure is not limited thereto and other suitable dimensions may be used. Optionally a Ge buffer layer 3 may then be formed at the bottom of the trench where the silicon is exposed, e.g. in accordance with the methods described in US 2012/0032234. Alternatively, a V-groove approach may be used (not illustrated). As illustrated in FIG. 2(*c*), next a stack of III-V material layers 4, 5, 6 is provided by selective epitaxial growth, thereby forming a narrow III-V waveguide 100 at least partially in the trench 10. The stack of III-V material layers may comprise a lower cladding layer 4 (pillar'), an active layer 5 (such as e.g. an InGaAs layer or an InGaAsP layer) and an upper cladding layer 6. The active layer 5 may for example have a thickness in the range between 50 nm and 200 nm and forms the core layer of the III-V waveguide 100. The lower cladding layer 4 and the upper cladding layer 6 form vertical claddings for the active layer 5 and the electrically insulating layer 2 forms lateral claddings at both lateral sides of the III-V stack. Although in FIG. 1 and in FIG. 2 the lower cladding layer 4 has substantially the same thickness as the insulating layer 2, the present disclosure is not limited thereto. The thickness of the lower cladding layer 4 may also be smaller or larger than the thickness of the insulating layer 2.

In order to confine the light in the upper section of the III-V waveguide 100, a high refractive index material layer 7 such as an amorphous silicon layer, a polycrystalline silicon layer or a silicon nitride layer may be deposited over the III-V waveguide structure and the insulating layer 2, e.g. silicon oxide layer, surrounding the III-V waveguide structure, as illustrated in FIG. 2(*d*). The refractive index of layer 7 is higher than the refractive index of insulating layer 2. For example, when the insulating layer 2 is a silicon oxide layer with a refractive index of about 1.46, a suitable refractive index for layer 7 may be in the range between 2 and 4. It may be an advantage of using amorphous silicon or silicon nitride for forming the high index material layer 7 that these materials may be deposited at a low temperature (for example at a temperature in the range between 150° C. and 250° C.).

Figure 3:
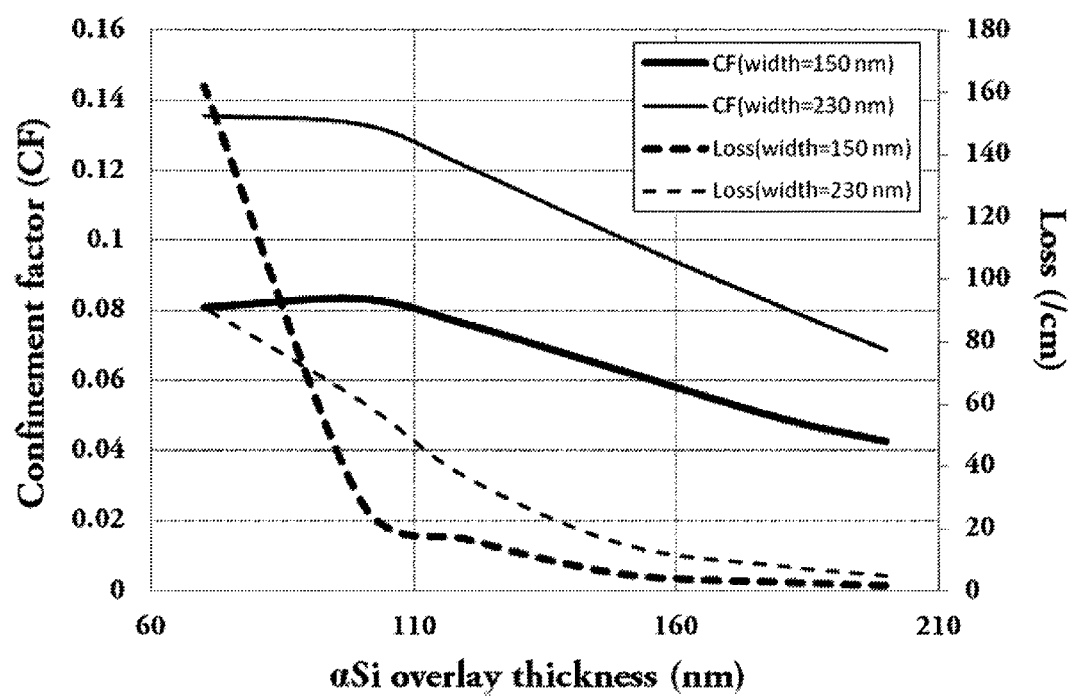
FIG. 3 shows the calculated optical confinement factor (full lines) in the active layer of a device of the present disclosure as shown in FIG. 1, and the optical mode loss (dashed lines) for different widths of the III-V waveguide, as a function of overlay thickness.

The high refractive index of layer 7 helps to pull the optical mode upwards, thereby substantially reducing the substrate leakage losses. The thicker the overlay is, the larger the portion of the optical mode that is confined in the high index material layer 7 and the lower the leakage loss is. However, for a thicker overlay 7 the optical confinement of the optical mode in the III-V active layer 5 is reduced and the achieved optical gain may be insufficient for lasing. Therefore, when selecting a suitable thickness for the overlay 7, a compromise needs to be made between overall optical mode loss and optical mode gain. FIG. 3 shows the calculated optical confinement factor CF (full lines) in a 60 nm thick active layer 5 and the loss (dashed lines) of the optical modes for two different widths of the III-V waveguide (150 nm and 230 nm), as a function of the amorphous silicon layer (overlay 7) thickness. The optical confinement factor is defined as the portion of the total optical power that is confined in the active region. The loss corresponds to the overall optical loss of the optical mode, including leakage losses and absorption losses. As the overlay thickness increases, the confinement factor in the active layer 5 decreases and low gain is expected, which may be disadvantageous for lasing. On the other hand, the optical loss is reduced when the overlay thickness increases, which enhances the chances of lasing. A parameter window may be determined for which lasing may be achieved theoretically. Based on the known material gain of the active material, the mode gain may be calculated by multiplying the material gain by the confinement factor. A lasing condition may then be obtained when the mode gain is larger than the optical losses. For example, assuming an active material gain of 2000/cm, based on the exemplary data shown in FIG. 3, the optical gain may be over 100/cm, which may overcome the optical loss when the thickness of the overlay 7 is larger than 90 nm, and allow lasing.

In an embodiment of the present disclosure, a laser cavity may be formed by cleaving or cutting the sample to form two reflective mirrors. Cleaving or cutting is preferably done along a first plane that is substantially orthogonal to the longitudinal axis of the III-V waveguide and along a second plane parallel to the first plane. However, more advanced laser cavities may be formed by patterning the overlay 7. For example, a DFB laser may be constructed by etching a grating only in the overlay 7, e.g. amorphous silicon overlay. Compared with prior art III-V DFB lasers, etching the gratings only in the overlay (and not the III-V layers) avoids damaging the III-V materials. In addition, a laser of the present disclosure may be substantially more compact. The length of the cavity may for example be in the range between a few hundreds of micrometer up to a few mm. However, the present disclosure is not limited thereto.

Compared to a prior art approach based on bonding III-V layers on a silicon waveguide, a better heat dissipation may be obtained with a laser structure of the present disclosure. Heat distribution simulations made for a structure as shown in FIG. 1 revealed that a good heat conduction towards the substrate may be obtained in devices according to embodiments of the present disclosure. In addition, III-V material consumption is strongly reduced as compared to prior art approaches. Generally, it may be an advantage of a device configuration in accordance with the present disclosure that good vertical and lateral optical confinement can be obtained. Therefore the device may be smaller than prior art devices.

A III-V waveguide laser integrated on a silicon photonics platform according to an embodiment of the present disclosure may for example be optically connected to other photonic devices on the same platform by using the high index material layer 7 as a device layer for the realization of these other photonic devices. In alternative solutions, the silicon substrate layer of a SOI (Silicon On Insulator) substrate may be used as a substrate for growing the III-V waveguide laser and the device layer of the SOI substrate may be used for the realization of other photonic devices.

Figure 4A:
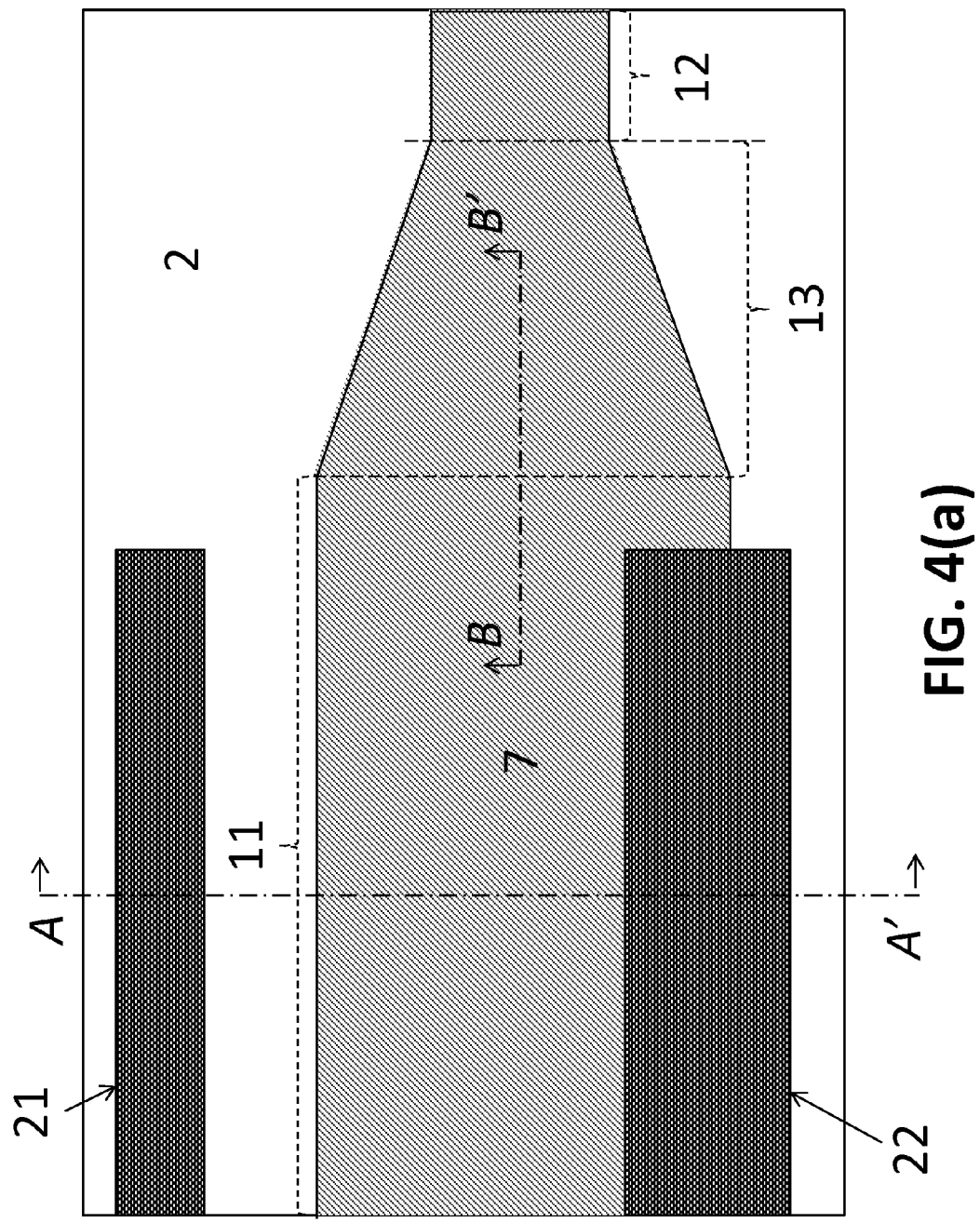
FIG. 4(a) is a top view.
Figure 4B:
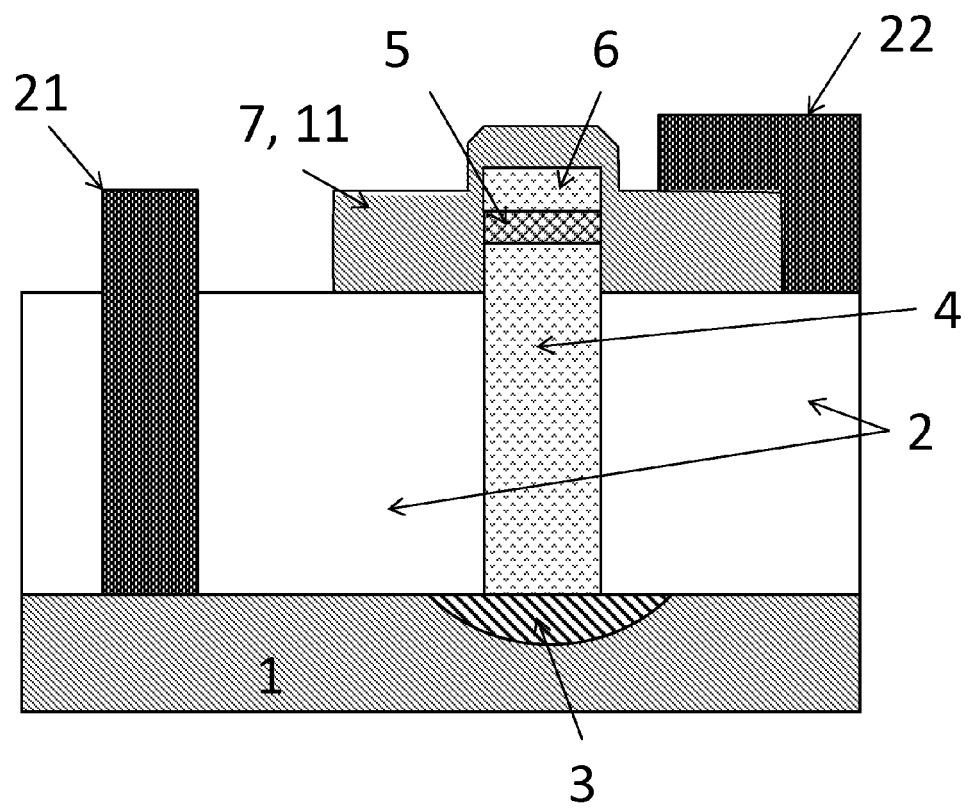
FIG. 4(b) is a cross section along line AA' and FIG. 4(c) is a cross section along line BB'.
Figure 4C:
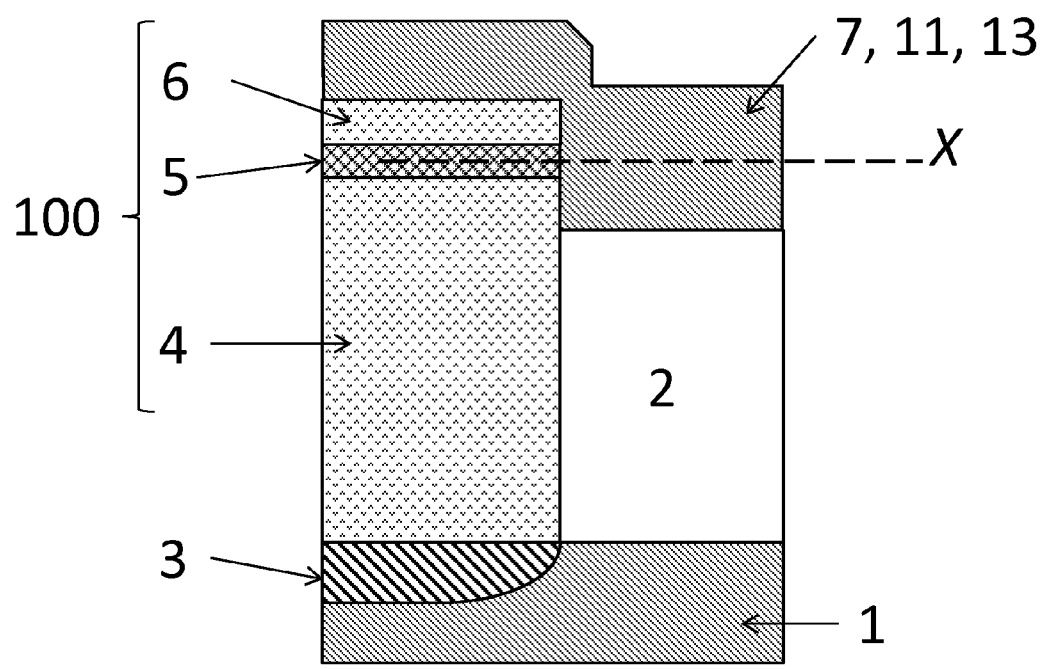

FIG. 4 illustrates a scheme that may be used for direct coupling of a laser according to an embodiment of the present disclosure with an optical waveguide, and a scheme for electrical injection. FIG. 4(*a*) shows a top view; FIG. 4(*b*) shows a cross section along line AA' and FIG. 4(*c*) shows a cross section along line BB'. In this approach, the electrically insulating layer 2 (lateral cladding layer) of the III-V waveguide laser has a predetermined thickness that is smaller than the thickness of the lower cladding layer 4, as illustrated in FIG. 4(*b*) and FIG. 4(*c*). The predetermined thickness of the electrically insulating layer 2 is selected to enable good coupling to an output waveguide, as further illustrated. The overlay 7, comprising a layer of a high refractive index material (such as for example amorphous silicon, polycrystalline silicon or silicon nitride) as described above, is patterned to form a waveguide core. FIG. 4(*a*) is a top view of the resulting structure, showing as an example the overlay 7 (waveguide core) having a first, wider waveguide portion 11 and a second, narrower waveguide portion 12. The wider waveguide portion 11 covers the III-V layer stack, e.g. InP/InGaAs/InP stack, and extends at both lateral sides beyond the lateral edges of the III-V layer stack. A laser waveguide (carrying the laser optical mode) is formed by a combination of the III-V waveguide layer stack 100 and the overlay 7. The narrower waveguide portion 12 functions as an output waveguide. The tapered section 13 between the first waveguide portion 11 and the second waveguide portion 12 transforms the optical mode of the wider waveguide portion 11 to the optical mode of the narrower waveguide portion 12. The predetermined thickness of the electrically insulating layer 2 can be selected such that the laser mode is aligned to a central portion of the narrower waveguide portion 12 (output waveguide), as schematically indicated in FIG. 4(c) by the dashed line X. The present disclosure is not limited to that exact position, and the alignment may be over or under said position. FIG. 4(b) also illustrates an approach that may be used for enabling electrical injection. A first metal comprising contact 21 (bottom contact) for bottom carrier injection is provided in a via or trench in the electrically insulating layer 2. The first metal comprising contact 21 is electrically connected to the lower cladding layer 4, through the silicon substrate 1. The silicon substrate 1 is preferably doped, e.g. with a doping concentration that is higher (e.g. in the order of $10^{19}$ cm$^{-3}$) in a region where the first metal comprising contact 21 is provided (in order to have a low contact resistance), and lower (e.g. in the order of $10^{18}$ cm$^{-3}$) closer to the region where the III-V epitaxial stack 100 is located (in order to limit optical losses). The lower cladding layer 4 (e.g. InP layer) is preferably doped with medium concentration (e.g. in the range between $10^{18}$ cm$^{-3}$ and $10^{19}$ cm$^3$) to facilitate carrier injection from the silicon substrate 1 at the bottom of the III-V layer stack. For top carrier injection a second metal comprising contact 22 (top contact) is provided, the second metal comprising contact 22 partially covering the overlay 7 at a lateral side of the first waveguide portion 11. This second metal comprising contact 22 is in electrical contact with the upper cladding layer 6 through overlay 7. The first waveguide portion 11 (waveguide core layer) is also doped (doping concentration e.g. in the range between $10^{18}$ cm$^{-3}$ and $10^{19}$ cm$^3$) in the region covered by the second metal comprising contact 22. In one example, the doping concentration of the first waveguide portion 11 decreases closer to the III-V layer stack to limit optical losses that may be caused by free carrier absorption. The upper cladding layer 6 (e.g. InP layer) is preferably doped with medium concentration (e.g. in the range between $10^{18}$ cm$^{-3}$ and $10^{19}$ cm$^{-3}$) for good carrier injection. In order to enable a good electrical injection, it may be advantageous to use polycrystalline silicon as a material for the overlay 7, wherein the polycrystalline film is formed by first depositing an amorphous silicon layer, and then annealing the amorphous silicon layer using a local heating process (e.g. excimer laser annealing). During this annealing step, dopants present in the amorphous silicon layer may be activated, making the layer suitable for current injection.

In a method for fabricating the device of FIG. 4, the III-V layer stack (such as for example an InP/InGaAs/InP stack) is first grown in a trench formed in the electrically insulating layer 2 on the silicon substrate 1, as described above. Then an etching process, such as a wet etching process, may be carried out to selectively remove an upper portion of the electrically insulating layer 2, thereby partially exposing the lateral sides of the III-V layer stack (e.g. InP/InGaAs/InP stack), and exposing the upper cladding layer 6, the active layer 5, and part of the lower cladding layer 4. A predetermined amount of the electrically insulating layer 2 is removed, the predetermined amount being selected to enable good coupling to the output waveguide 12 (to be formed in a later step). In a next step, a layer 7 of a high refractive index material (e.g. having a refractive index in the range between 2 and 4), such as for example an amorphous silicon layer or a silicon nitride layer is deposited, covering the whole sample surface. The high refractive index material layer is then patterned to form a waveguide core, the waveguide core having a first, wider waveguide portion 11, a second, narrower waveguide portion 12 and a tapered section 13 between the first waveguide portion 11 and the second waveguide portion 12. Patterning of layer 7 may for example be done by means of optical lithography and an ICP (Inductively Coupled Plasma) or a RIE (Reactive Ion Etching) dry etching process, the present disclosure not being limited thereto. Next a via is etched in the electrically insulating layer 2 and filled with a metal to form the first metal comprising contact 21. Before providing the electrically insulating layer 2 on the silicon substrate 1, the silicon substrate is doped. The doping concentration is higher (e.g. in the order of $10^{19}$ cm$^{-3}$) in a region where the first metal comprising contact 21 is to be formed (e.g., in the via region), and it is lower (e.g. in the order of $10^{18}$ cm$^{-3}$) closer to the region where III-V epitaxial growth is to be done to form the laser structure. The second metal comprising contact 22 (top contact) is deposited on the highly doped region of the first waveguide portion 11 to enable top carrier injection.

Figure 5A:
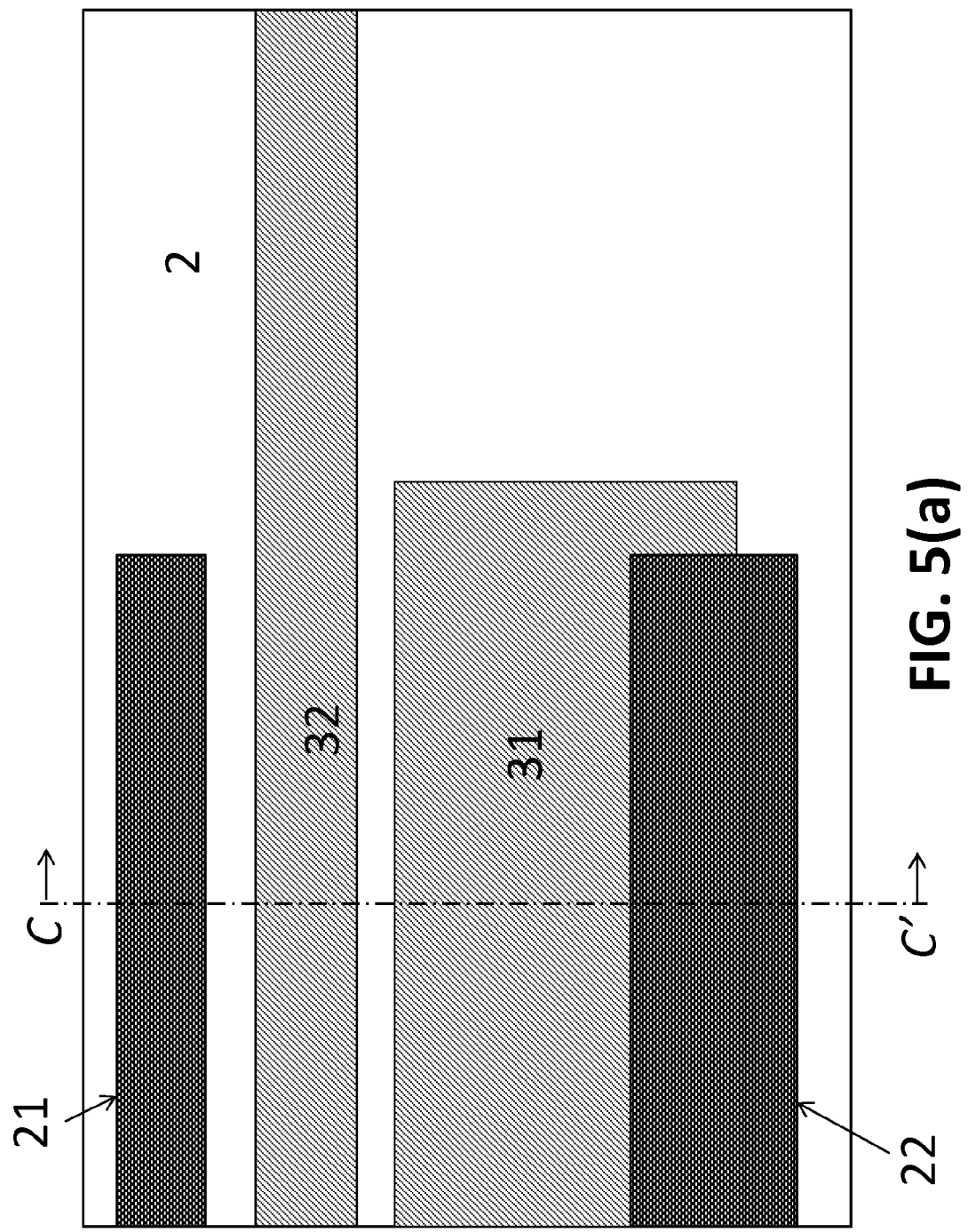
FIG. 5(a) is a top view.
Figure 5B:
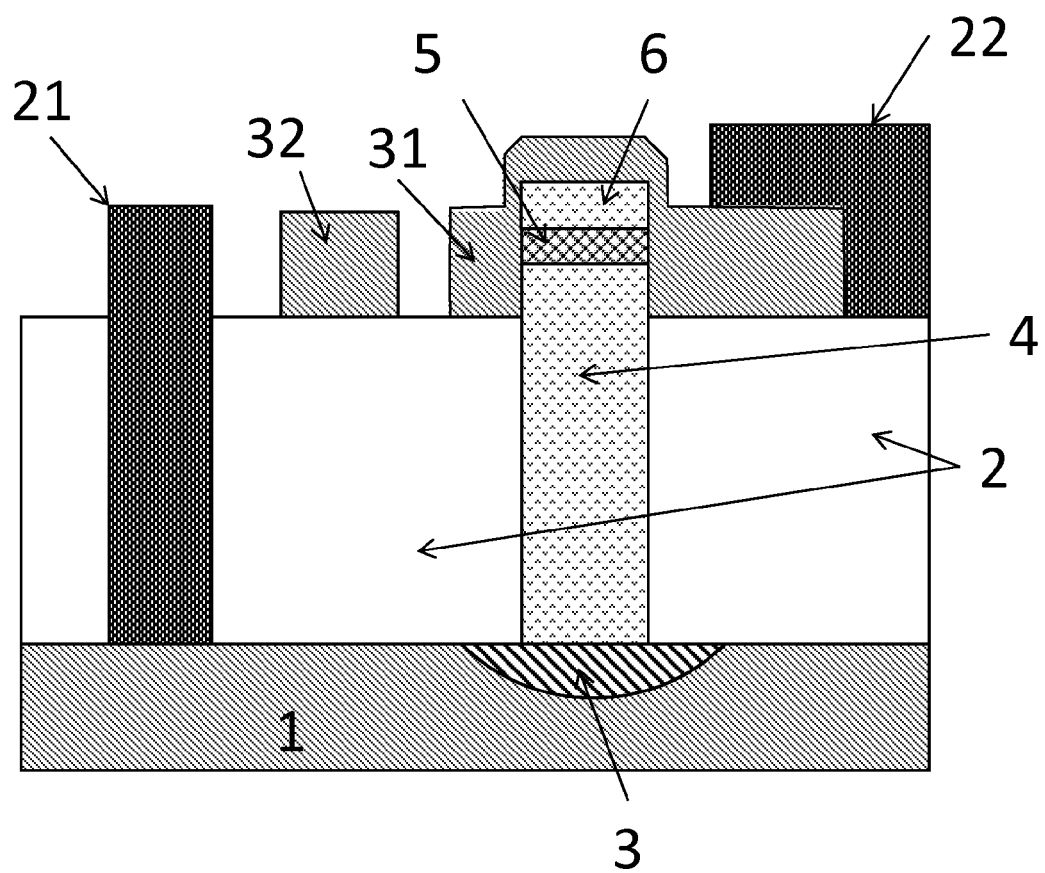
FIG. 5(b) is a cross section along line CC'.

Another approach that may be used for light coupling between a laser structure of the first aspect of the present disclosure and an output waveguide is illustrated in FIG. 5. This approach is based on side coupling (evanescent coupling) between the laser and an output waveguide. FIG. 5(a) shows a top view and FIG. 5(b) shows a cross section along line CC'. FIG. 5(b) illustrates an example wherein the electrically insulating layer 2 (lateral cladding layer) of the III-V waveguide laser has a thickness that is smaller than the thickness of the lower cladding layer 4. However, the present disclosure is not limited thereto and the thickness of the electrically insulating layer 2 may also be equal to or larger than the thickness of the lower cladding layer 4. The overlay 7, comprising a layer of a high refractive index material (such as for example amorphous silicon, polycrystalline silicon or silicon nitride, the present disclosure not being limited to said examples) as described above, is patterned to form a first waveguide core 31 covering the III-V layer stack and extending at both lateral sides beyond the lateral edges of the III-V layer stack. A second waveguide 32 (output waveguide) is provided, with its longitudinal axis substantially parallel to the longitudinal axis of the first waveguide 31. The second waveguide 32 may advantageously be formed from the same material as the overlay 7, but the present disclosure is not limited thereto and other materials may be used. The second waveguide 32 is provided at a distance of less than 500 nm from the first waveguide 31 to allow lateral coupling of the evanescent field of the laser mode from the first waveguide 31 to the second waveguide 32. In this way side coupling between the first waveguide 31 and the second waveguide 32 may be realized, and thus coupling from the laser to an output waveguide (second waveguide 32). Electrical injection may be realized in a way similar to the approach described with respect to the embodiment of FIG. 4.

Figure 6A:
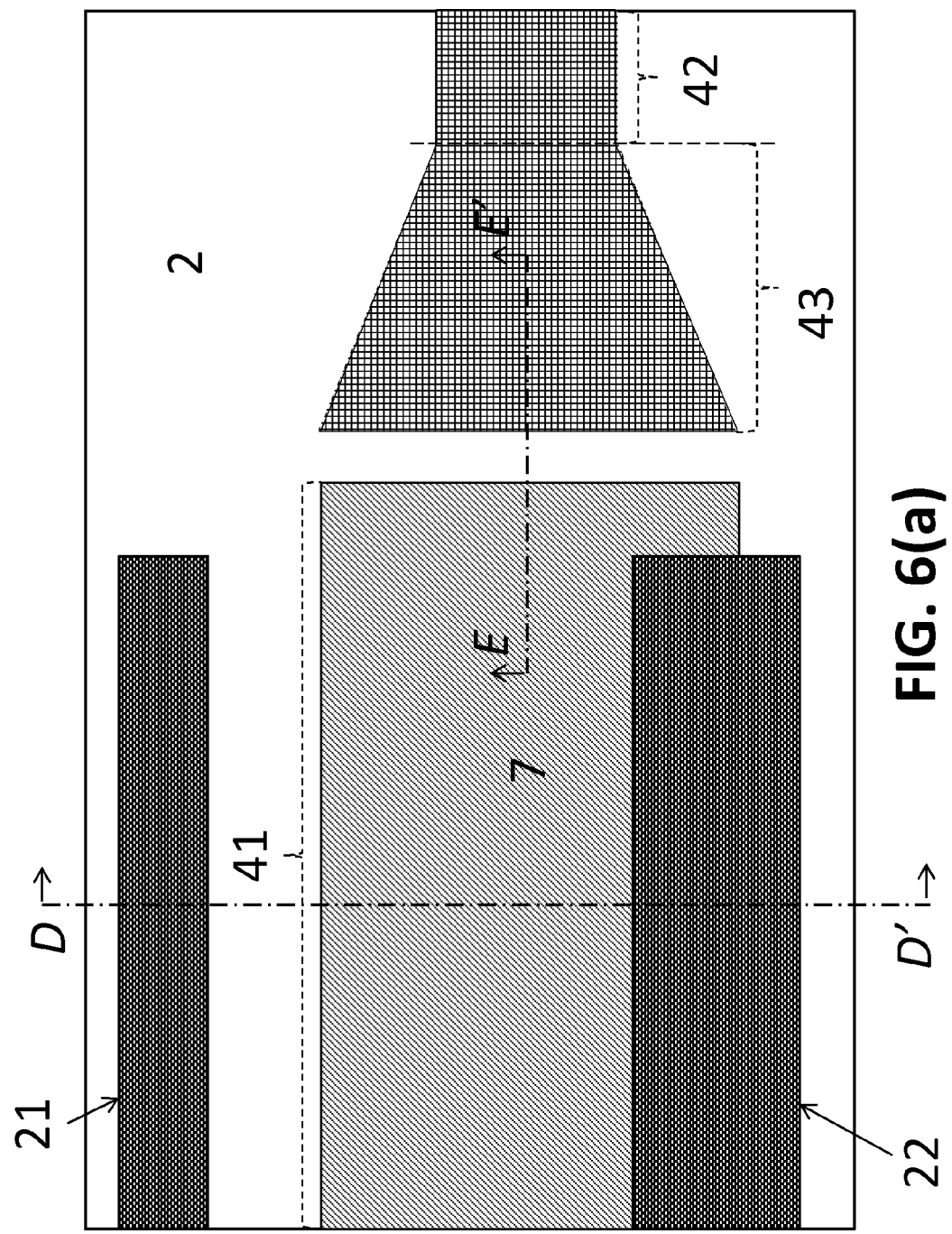
FIG. 6(a) is a top view.
Figure 6B:
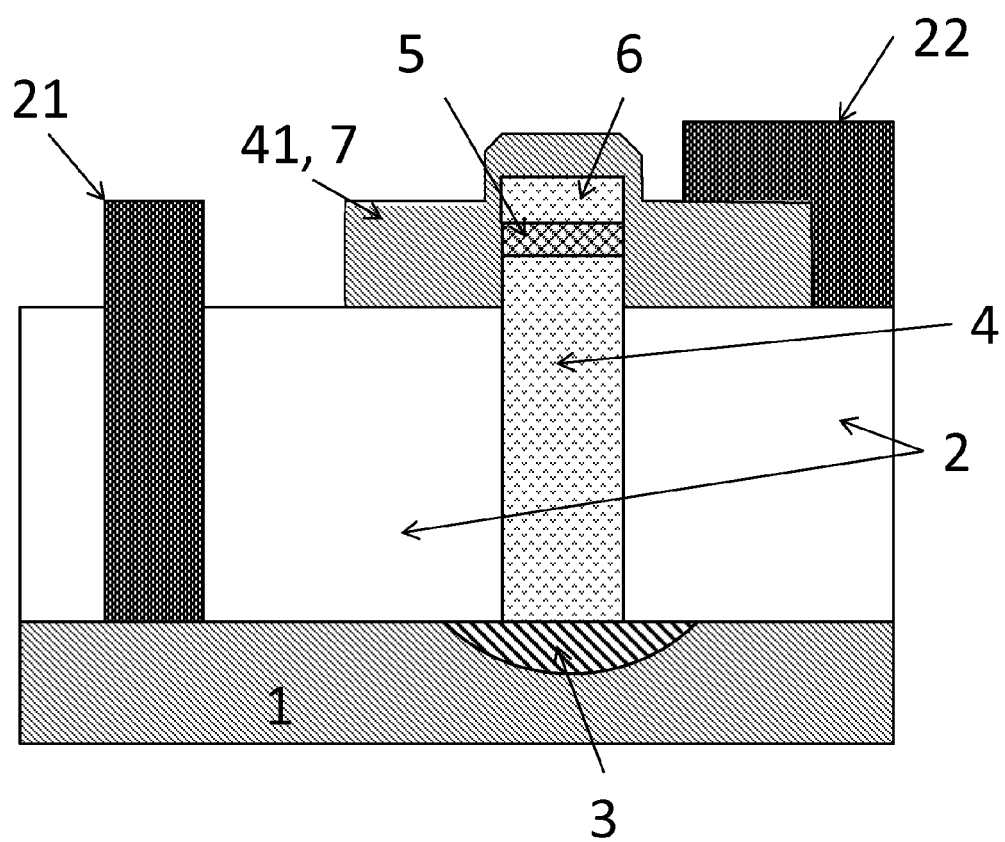
FIG. 6(b) is a cross section along line DD' and FIG. 6(c) is a cross section along line EE'.
Figure 6C:
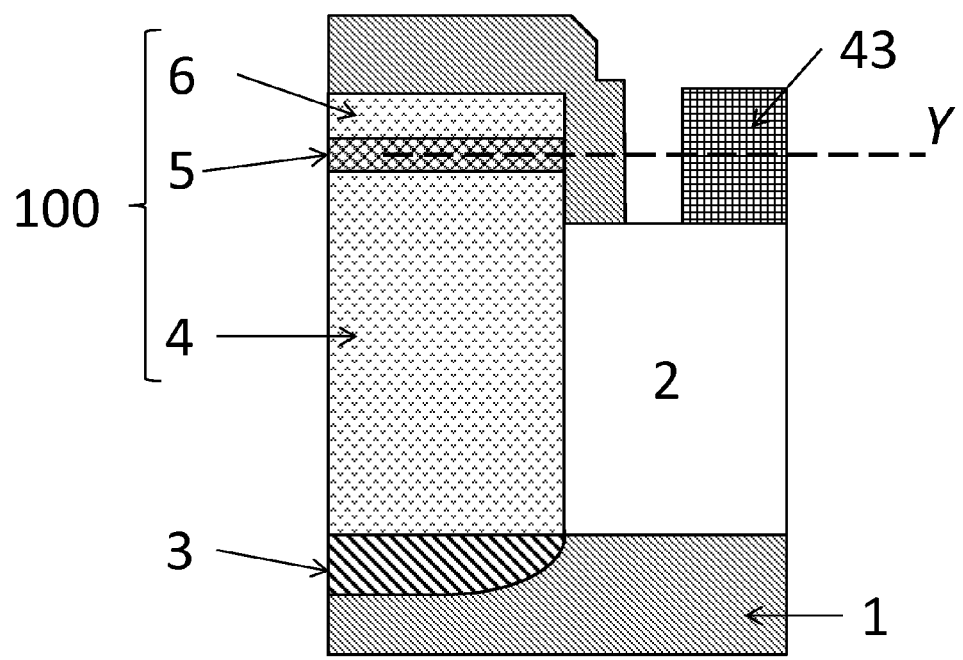

FIG. 6 illustrates an approach for waveguide coupling wherein the output waveguide is a predefined SOI waveguide. FIG. 6(a) shows a top view, FIG. 6(b) is a cross section along line DD' and FIG. 6(c) is a cross section along line EE'. In this approach, for a given thickness of the electrically insulating layer 2, the lower cladding layer 4 of the III-V waveguide laser has a predetermined thickness that is larger than the thickness of the electrically insulating layer 2, as illustrated in FIG. 6(b). The predetermined thickness of the lower cladding layer 4 and the thickness of the active layer 5 are selected to enable good coupling to an output waveguide 42, as schematically indicated in FIG. 6(c) by the dashed line Y. The overlay 7, comprising a layer of a high refractive index material (such as for example amorphous silicon, polycrystalline silicon or silicon nitride) as described above, is patterned to form a first waveguide core 41 (FIG. 6(a)) covering the III-V layer stack 100 and extending at both lateral sides beyond the lateral edges of the III-V layer stack. A silicon waveguide formed in the device layer of the SOI wafer is used as an output waveguide 42. It includes a tapered section 43 at an end facing the first waveguide 41, to enable good coupling of the optical mode from the wider first waveguide portion 41 to the optical mode of the narrower output waveguide 42. By controlling the thickness of the lower cladding layer 4, the active layer 5 is located at a predetermined position that is aligned to a central portion of the SOI output waveguide 42, 43.

A fabrication method for the device structure shown in FIG. 6 may for example include first forming the silicon waveguide 42 including the tapered section 43 in the silicon device layer of an SOI substrate, for example by optical lithography and ICP or RIE etching. Next, a layer of silica or another low refractive index material may be deposited over the entire sample surface, followed by a surface planarization step, for example by CMP (Chemical Mechanical Polishing) down to the upper surface of the SOI device layer. Next, a trench may be formed and filled with a III-V layer stack by epitaxial growth as described above. Next, an etching process, such as a wet etching process, may be carried out to selectively remove the deposited low refractive index material, thereby partially exposing the III-V layer stack (e.g. InP/InGaAs/InP stack), and exposing an upper portion of this stack. In a next step, a layer of a high refractive index material, such as for example an amorphous silicon layer or a silicon nitride layer may be deposited, covering the whole sample surface. Then the high refractive index material layer may be patterned to form a first waveguide core 41 covering the III-V layer stack and laterally extending over its edges, thereby forming a hybrid laser waveguide. Electrical injection may be realized in a similar way as in the embodiment of FIG. 4.

Figure 7:
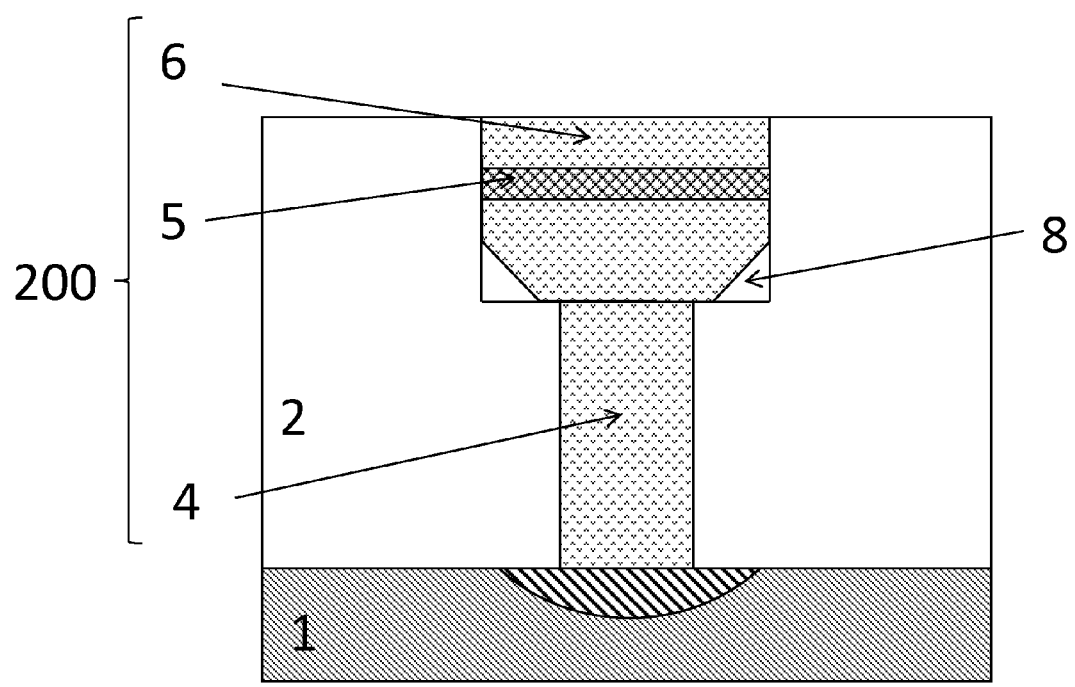
FIG. 7 shows a cross section of a sub-micron hybrid laser with T-shaped waveguide according to an embodiment of the present disclosure.
Figure 8:
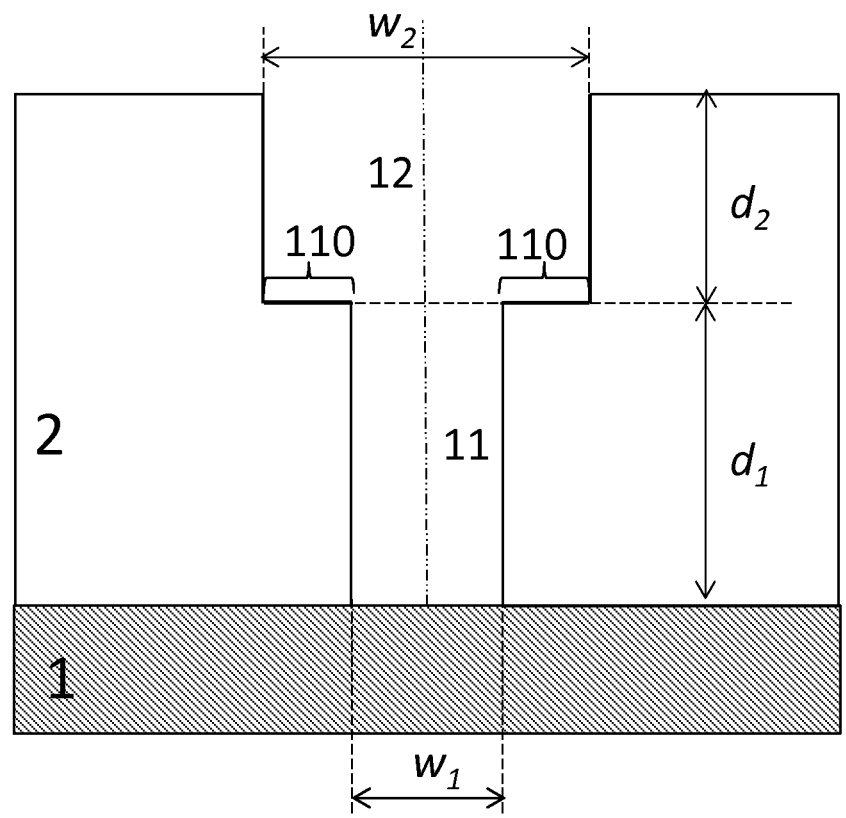
FIG. 8 schematically illustrates a T-shaped trench, containing a first, narrow trench portion and a second, wider trench portion on top of the first trench portion.

In embodiments of the present disclosure, good optical confinement and low substrate losses may be obtained by using a T-shaped III-V waveguide configuration, e.g., a waveguide having a T-shaped cross section. In such embodiments the need for providing an overlay may be avoided. FIG. 7 shows an example of such a T-shaped waveguide laser (cross section). In this configuration the trench formed in the silicon dioxide layer 2 on the silicon substrate 1 has a T-shaped cross section, as illustrated in FIG. 8. The trench comprises a first, narrow trench portion 11 in a lower portion of the silicon dioxide layer 2 (e.g., in a portion of the silicon dioxide layer adjacent to the silicon substrate 1) and a second, wider trench portion 12 in an upper portion of the silicon oxide layer, on top of and aligned with the first trench portion 11. The wider trench portion 12 and the narrow trench portion 11 are preferably aligned such that they have substantially the same center axis in a direction orthogonal to the substrate. In this way a plateau 110 is formed in the lateral cladding layer 2 at both lateral sides of the trench, at an interface between the wider trench portion 12 and the narrow trench portion 11. This is schematically illustrated in FIG. 8. The first trench portion 11 has a width w1 and a depth d1. The second trench portion 12 has a width w2 and a depth d2. For example, in a device of the present disclosure w1 may be in the range between 50 nm and 200 nm, w2 may be in the range between 400 nm and 800 nm, e.g. about 500 nm, d1 may be in the range between 400 nm and 600 nm, e.g. about 500 nm and d2 may be in the range between 250 nm and 600 nm, e.g. about 300 nm. However, the present disclosure is not limited thereto and other suitable dimensions may be used.

A T-shaped trench may for example be formed by two successive and well aligned lithography and etch steps. Next, during epitaxial growth of the III-V layers, under certain mask design and growth conditions, first the narrow trench portion 11 is filled with III-V material and afterwards lateral growth allows filling the wider trench portion 12. It was found that the material quality of the III-V epitaxial layers may for example be improved by properly selecting the orientation of the trench and/or by using off-cut silicon wafers.

Experiments were done wherein 130 nm wide, 350 nm deep trenches were formed in a 350 nm thick silicon oxide layer on top of a (001) crystalline silicon substrate. A plurality of trenches was formed, each trench being aligned along a different orientation with respect to the [110] direction. An InP layer was then provided in the trenches by local epitaxial growth in a MOCVD reactor, using a Ge seed layer in accordance with the method described in US 2012/0032234. After filling of the trenches, the InP growth was continued, resulting in lateral overgrowth at the top of the trenches. The material quality was analyzed by SEM (Scanning Electron Microscopy), TEM (Transmission Electron Microscopy) and PL (photoluminescence), and it was found that the InP material quality was highly trench orientation dependent. Based on SEM analysis of the sample, it was found that InP layers grown in trenches along <130> directions had the best surface uniformity (lowest surface roughness). A PL analysis was done, wherein the sample surface was pumped with a 532 nm laser and the photoluminescence emission was collected from the InP layers grown in the different trenches. For trenches aligned along <130> directions the brightest photoluminescence emission was observed, indicating the best material quality for these orientations. This is consistent with the observations based on the SEM analysis. TEM images further confirmed that InP layers grown in trenches aligned along <130> directions had the lowest defect density.

From these experiments, it may be concluded that using a trench with a longitudinal axis that is oriented along a <130> direction, such as between about 18 degrees and 24 degrees, or about 22 degrees, off the <110> direction results in a good material quality. It was also found that using a trench with this orientation is favorable for stimulating lateral overgrowth, as well as using a lower reactor temperature and a lower VIII precursor ratio during epitaxial growth.

In embodiments of the present disclosure, the wider trench portion 12 laterally confines the lateral epitaxial growth, such that a III-V waveguide 200 with a T-shaped cross section is obtained. The T-shaped III-V waveguide contains a lower, narrow waveguide portion and an upper, wider waveguide portion. Defects are trapped in the lower waveguide portion.

As illustrated in FIG. 7, small voids 8 (e.g. filled with air) may be formed at the corners of the wider trench portion 12. This is mainly related to tilted planes being formed along certain crystal directions during epitaxial growth. Based on simulations, the influence of these voids 8 on the optical performance of the device is estimated to be small, considering that the voids are located away from the optical mode center. Good optical confinement may be obtained in the wider portion of the III-V waveguide.

Based on simulations, it was shown that good light confinement may be obtained in the wider waveguide portion of a T-shaped waveguide laser according to an embodiment of the present disclosure, and that losses may be negligible. It was found that the T-shaped III-V waveguide substantially changes the optical mode distribution, since the upper waveguide portion may effectively keep the mode upwards, resulting in a substantial reduction of leakage losses.

Figure 9:
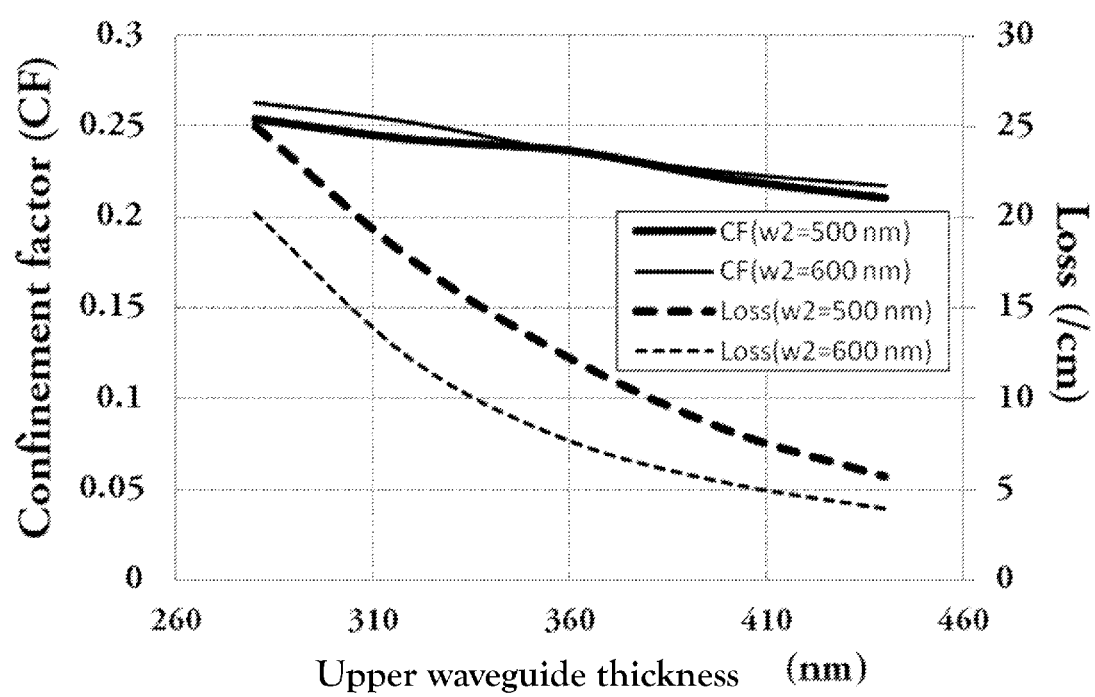
FIG. 9 shows the calculated optical confinement factor in the active layer and the optical mode loss for a device structure with a T-shaped waveguide according to an embodiment of the present disclosure.

Simulations have been done to investigate the useful design window for the III-V T-shaped waveguide dimensions. FIG. 9 shows the calculated optical confinement factor (full lines) and the optical mode loss (dashed lines) in the active layer 5. For the lower waveguide portion a thickness d1 of 400 nm was used, and a width w1 of 100 nm. The width w2 of the wider waveguide portion was fixed at 500 nm or at 600 nm, and the thickness d2 was varied from 280 nm to 440 nm. It may be concluded from the simulations that for a fixed width w2 (500 nm or 600 nm) of the wider waveguide portion the confinement factor exceeds 20% for the simulated range of thicknesses d2. Considering the low optical losses, the resultant high optical gain is sufficient to enable lasing. An even better confinement and a lower optical loss may be expected when further increasing the width or the thickness of the upper waveguide portion.

The laser cavity may be formed by cleaving or cutting the sample to form two reflective mirrors. Cleaving or cutting is preferably done along a first plane that is substantially orthogonal to the longitudinal axis of the III-V waveguide and along a second plane parallel to the first plane. However, more advanced laser cavities may be formed by patterning the wider portion of the III-V waveguide. For example, a DFB laser may be constructed by etching a grating in the upper cladding layer.

It may be an advantage of a device according to embodiments of the disclosure that a compact device (sub-micron) may be made at a low cost. Besides the compact device size, the waveguide configuration also has a vertical light confinement effect (by the SiO$_2$ plateau at the interface between the narrow and wide waveguide portions). This helps substantially reducing the substrate leakage loss.

Figure 10A:
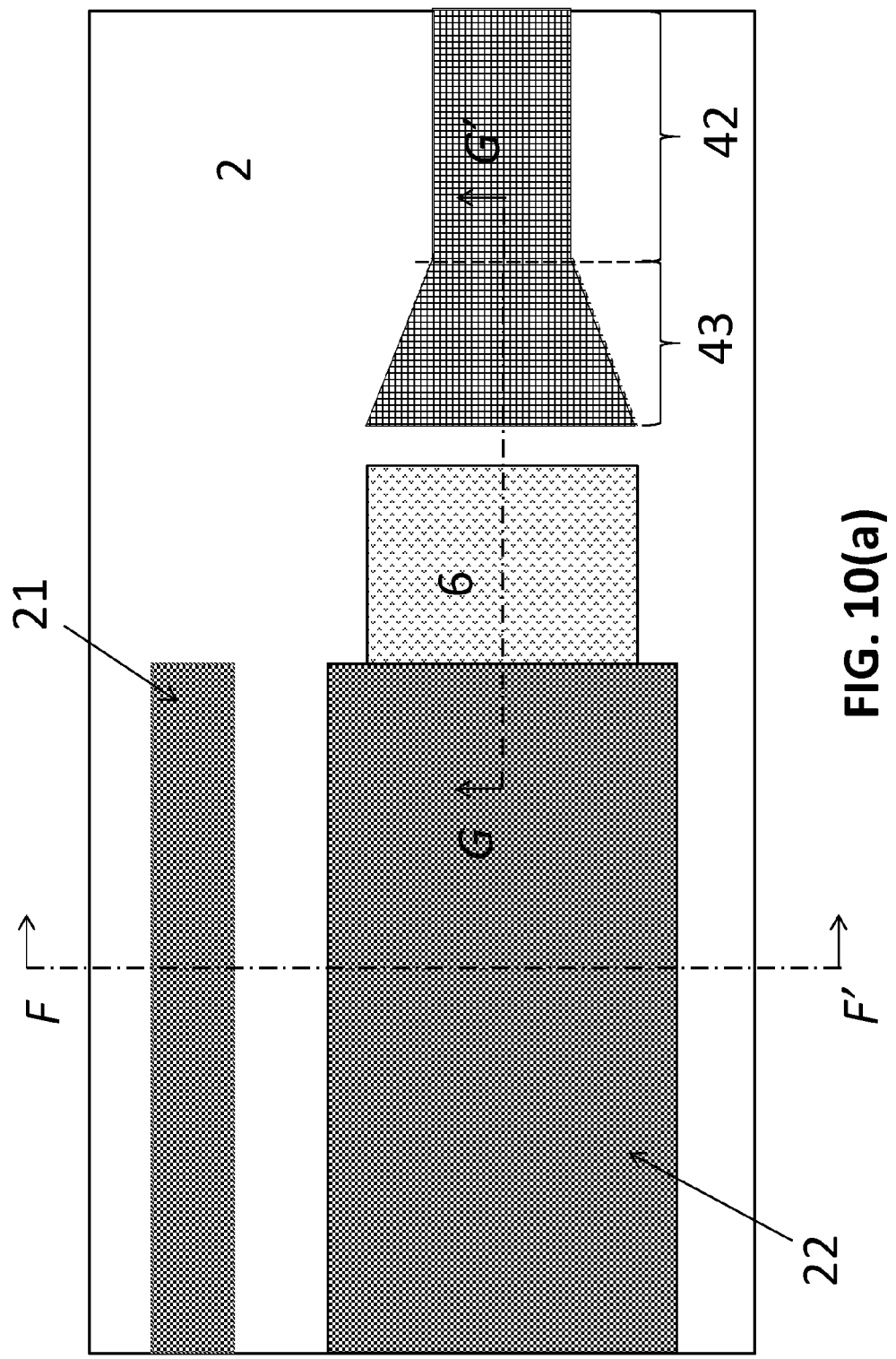
FIG. 10(a) is a top view.
Figure 10B:
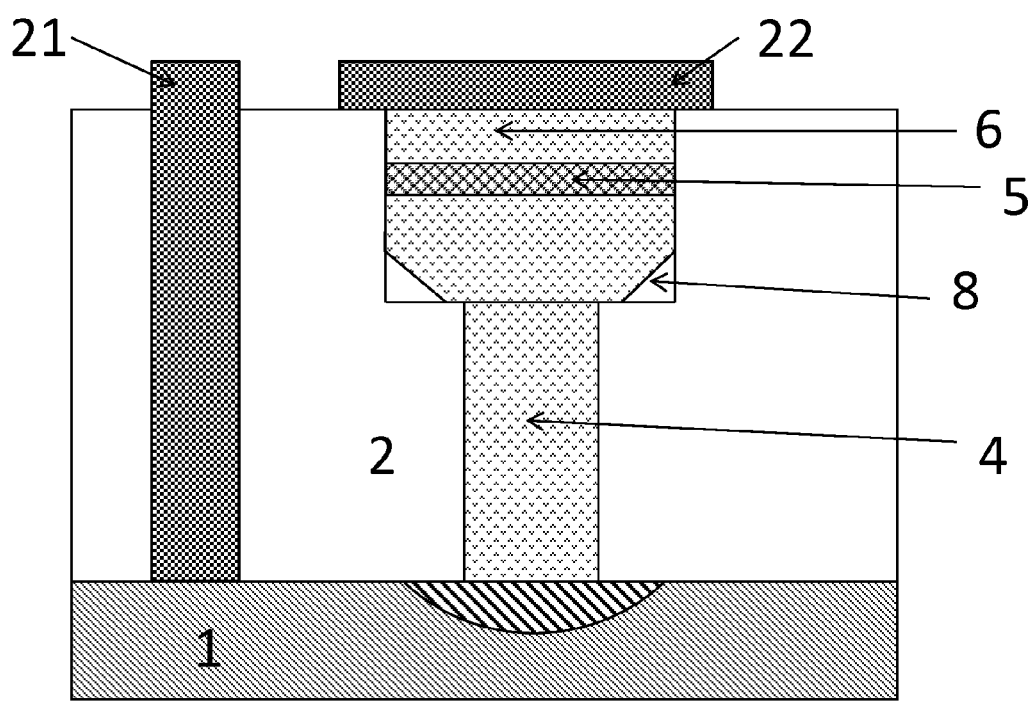
FIG. 10(b) is a cross section along line FF' and FIG. 10(c) is a cross section along line GG'.
Figure 10C:
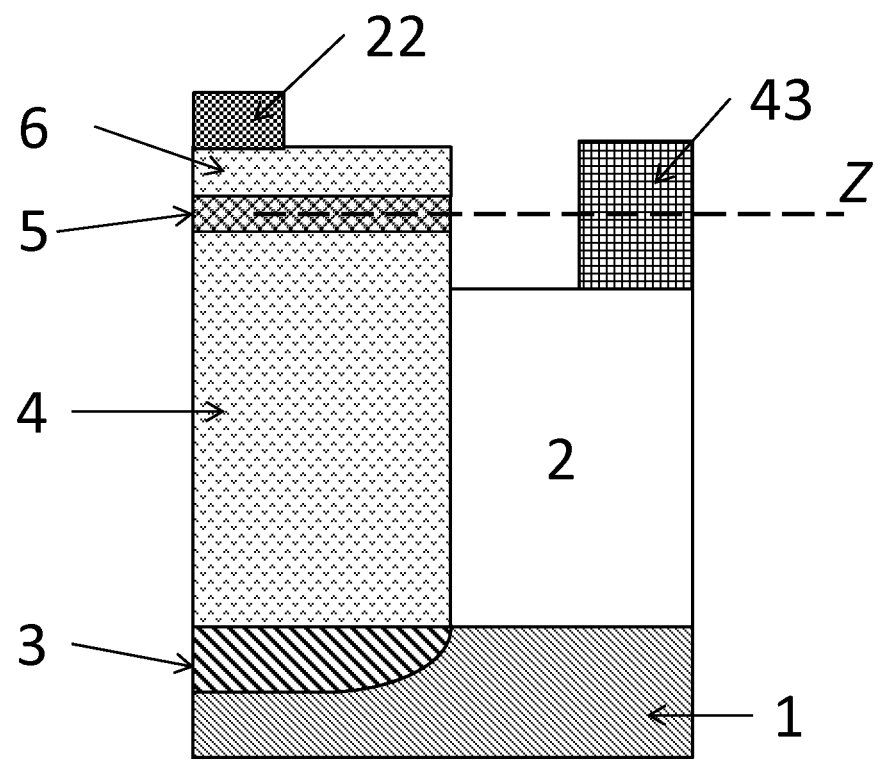

FIG. 10 illustrates an exemplary scheme that may be used for waveguide coupling and for electrical injection of a laser with a T-shaped cross section according to embodiments of the present disclosure. FIG. 10(a) shows a top view, FIG. 10(b) is a cross section along line FF' and FIG. 10(c) is a cross section along line GG'. In this approach, a silicon waveguide formed in the device layer of the SOI wafer is used as an output waveguide 42. As illustrated in FIG. 10(a), it includes a tapered section 43 at an end facing the laser, to enable good coupling of the optical mode from the laser to the optical mode of the narrower output waveguide 42. By controlling the thickness of the lower cladding layer 4, the active layer 5 is located at a predetermined position that is aligned to a central portion of the SOI output waveguide (indicated by dashed line Z in FIG. 10(c)). This allows good coupling of the laser mode from the active layer 5 to the output waveguide 42. Regarding the electrical injection, the bottom contact 21 is similar to what is described above related to the device structure of FIG. 4. The top contact 22 is formed by depositing a metal comprising contact directly on the T-shaped waveguide. Doping of the upper cladding layer 6 may facilitate carrier injection. Preferably the doping concentration of the upper cladding layer 6 is larger closer to the top metal comprising contact 22.

Based on simulations, the laser configurations of the present disclosure are predicted to exhibit low threshold and good thermal dissipation, given the small device footprint. The lasers may be pumped electrically. They may advantageously be used for intra-chip optical communication and for other applications that have stringent requirements related to power consumption, such as for example optical interconnects, supercomputing and cloud computing.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

While the above detailed description has shown, described, and pointed out novel features of the disclosure as applied to various embodiments, it will be understood that various omissions, substitutions, and changes in the form and details of the device or process illustrated may be made by those skilled in the technology without departing from the disclosure.

The invention claimed is:

1. A sub-micron III-V waveguide laser comprising:
   a local-epitaxy-grown channel waveguide having a width in the range between 50 nm and 800 nm and a height in the range between 500 nm and 1200 nm, wherein the channel waveguide has a first lateral side and a second lateral side;
   a lateral cladding layer adjacent to the first lateral side and the second lateral side of the channel waveguide; and
   a light confinement element for confining light in the local-epitaxy-grown channel waveguide, wherein the light confinement element comprises an overlay covering the channel waveguide and containing a high refractive index material having a refractive index that is higher than a refractive index of the lateral cladding layer.

2. The sub-micron III-V waveguide laser according to claim 1, wherein the channel waveguide comprises a III-V layer stack including a lower cladding layer, an active region, and an upper cladding layer.

3. The sub-micron III-V waveguide laser according to claim 1, wherein the laser is integrated on a semiconductor photonics platform.

4. The submicron III-V waveguide laser according to claim 1, wherein the high refractive index material comprises amorphous silicon, polycrystalline silicon, or silicon nitride.

5. The submicron III-V waveguide laser according to claim 1, wherein the light confinement element comprises a plateau being provided in the lateral cladding layer at the first lateral side and at the second lateral side of the channel waveguide.

6. The submicron III-V waveguide laser according to claim 5, wherein the channel waveguide has a T-shaped cross section.

7. The submicron III-V waveguide laser according to claim 6, wherein the channel waveguide contains a first, narrow waveguide portion having a width in the range between 50 nm and 200 nm and a height in the range between 400 nm and 600 nm, and a second, wider waveguide portion overlaying the first waveguide portion, wherein the second waveguide portion has a width in the range between 500 nm and 800 nm and a height between 250 nm and about 600 nm.

8. The submicron III-V waveguide laser according to claim 2, further comprising a first metal comprising contact in electrical contact with the lower cladding layer and a second metal comprising contact in electrical contact with the upper cladding layer,. wherein the first metal comprising contact and the second metal comprising contact are configured for electrical injection of charge carriers in the active region of the channel waveguide.

9. The submicron III-V waveguide laser according to claim 1, wherein the laser is optically connected to an output waveguide.

10. A method for integrating a sub-micron III-V waveguide laser on a semiconductor photonics platform, the method comprising:
- providing on a semiconductor substrate an electrically insulating layer;
- etching a trench having a width in the range between 50 nm and 800 nm through the electrically insulating layer, thereby locally exposing the silicon substrate;
- providing a III-V layer stack in the trench by local epitaxial growth to form a channel waveguide; and
- providing a light confinement element for confining radiation in the local-epitaxial-grown channel waveguide, wherein providing the light confinement element includes providing an overlay, wherein the overlay is a layer overlaying the III-V layer stack and containing a high refractive index material having a refractive index that is higher than a refractive index of the electrically insulting layer.

11. The method according to claim 10 wherein the high refractive index material comprises amorphous silicon, polycrystalline silicon, or silicon nitride.

12. The method according to claim 10, wherein providing the light confinement element further includes etching a trench in the electrically insulating layer, wherein the trench has a plateau at both lateral sides of the trench such that, after providing the III-V layer stack in the trench, a channel waveguide having a T-shaped cross section is obtained, wherein the channel waveguide has a first, narrow waveguide portion with a width in the range between 50 nm and 200 nm and a height in the range between 400 nm and 600 nm, and a second, wider waveguide portion overlaying the first waveguide portion, wherein the second waveguide portion has a width in the range between 500 nm and 800 nm and a height between 250 nm and 600 nm.

13. The method according to claim 10, further comprising providing, for charge carrier injection in the channel waveguide, a first metal comprising contact and a second metal comprising contact.

14. The sub-micron III-V waveguide laser according to claim 1, wherein the channel waveguide comprises an active region having a first lateral side and a second lateral side, and wherein the overlay covers the first lateral side and the second lateral side of the active region.

15. The submicron III-V waveguide laser according to claim 1, wherein the channel waveguide has a width in the range between 500 nm and 800 nm.

16. The submicron III-V waveguide laser according to claim 9, wherein the output waveguide comprises a high refractive index material having a refractive index that is higher than a refractive index of the lateral cladding layer, wherein the output waveguide has a longitudinal axis substantially parallel to a longitudinal axis of the channel waveguide, and wherein the laser is coupled to the output waveguide by evanescent coupling.

17. The method according to claim 10, wherein the channel waveguide comprises an active region having a first lateral side and a second lateral side, and wherein the overlay covers the first lateral side and second lateral side of the active region.

18. The method according to claim 10, wherein the trench has a width in the range between 500 nm and 800 nm.

19. A sub-micron III-V waveguide laser comprising:
- a local-epitaxy-grown channel waveguide having a width in the range between 50 nm and 800 nm and a height in the range between 500 nm and 1200 nm, wherein the channel waveguide has a first lateral side and a second lateral side;
- a lateral cladding layer adjacent to the first lateral side and the second lateral side of the channel waveguide; and
- a light confinement element for confining light in the local-epitaxy-grown channel waveguide, wherein the light confinement element comprises a plateau provided in the lateral cladding layer at the first lateral side and at the second lateral side of the channel waveguide.

20. The submicron III-V waveguide laser according to claim 19, wherein the channel waveguide has a T-shaped cross section, wherein the channel waveguide contains a first, narrow waveguide portion having a width in the range between 50 nm and 200 nm and a height in the range between 400 nm and 600 nm, and a second, wider waveguide portion overlaying the first waveguide portion, and wherein the second waveguide portion has a width in the range between 500 nm and 800 nm and a height between 250 nm and 600 nm.

\* \* \* \* \*